United States Patent [19]

Yamaguchi

[11] Patent Number: 4,747,079

[45] Date of Patent: May 24, 1988

[54] WRITE CIRCUIT FOR AN ERASABLE PROGRAMMABLE READ ONLY MEMORY DEVICE OF A MICROCOMPUTER

[75] Inventor: Satoru Yamaguchi, Nagoya, Japan

[73] Assignee: Fujitsu Limited, Kawasaki, Japan

[21] Appl. No.: 908,208

[22] Filed: Sep. 17, 1986

[30] Foreign Application Priority Data

Sep. 17, 1985 [JP] Japan ................. 60-206072

[51] Int. Cl.$^4$ ............................................ G11C 11/40
[52] U.S. Cl. ..................................... 365/189; 365/233
[58] Field of Search ................. 365/94, 103, 182, 189, 365/233

[56] References Cited

U.S. PATENT DOCUMENTS 4,707,811 11/1987 Takemae et al. .................... 365/233

*Primary Examiner*—Terrell W. Fears
*Attorney, Agent, or Firm*—Staas & Halsey

[57] ABSTRACT

A write circuit for an EPROM device of a microcomputer comprises a first circuit responsive to an external clock signal WCLK and machine clock signals for supplying a clock signal CLK to a program counter of the microcomputer so as to successively increment an address produced in the program counter, where the external clock signal WCLK has a frequency lower than those of the machine clock signals and the clock signal CLK has different frequencies during normal and write-in operation modes so that the address produced in the program counter is successively incremented in synchronism with the machine clock signals during the normal operation mode and is successively incremented in synchronism with the external clock signal WCLK during the write operation mode, and a second circuit responsive to the machine clock signals and a bit data of a LSB of the address from the program counter for generating a bit line clock signal BCLK for inhibiting a write-in data from being written into the EPROM device during a time period in which the address changes.

10 Claims, 4 Drawing Sheets

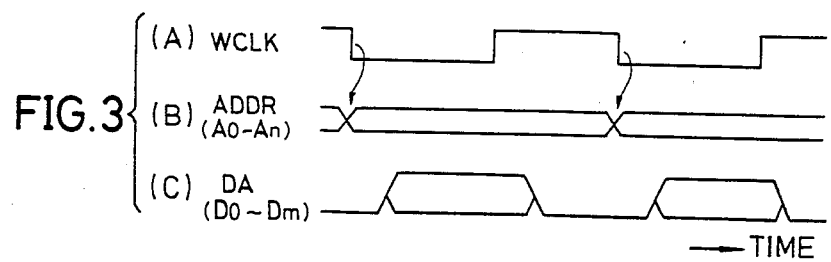
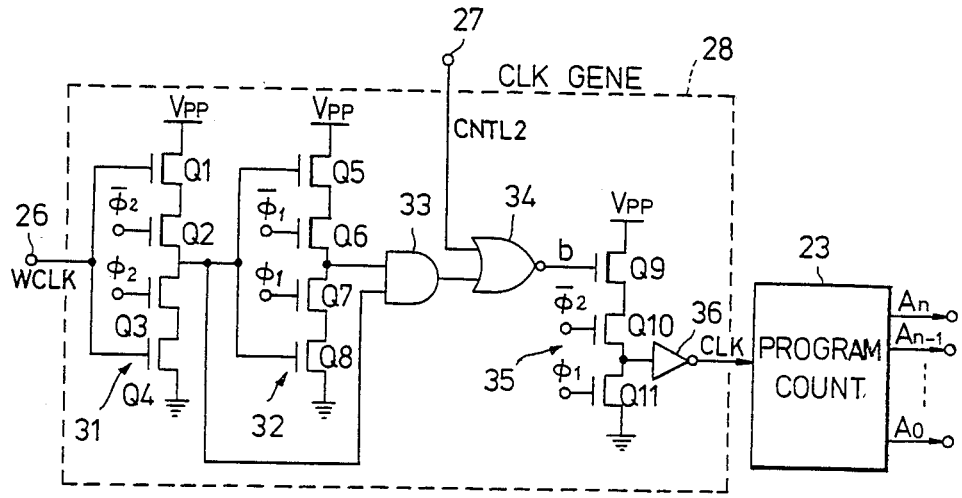
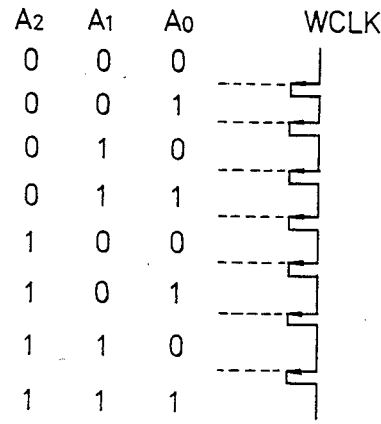

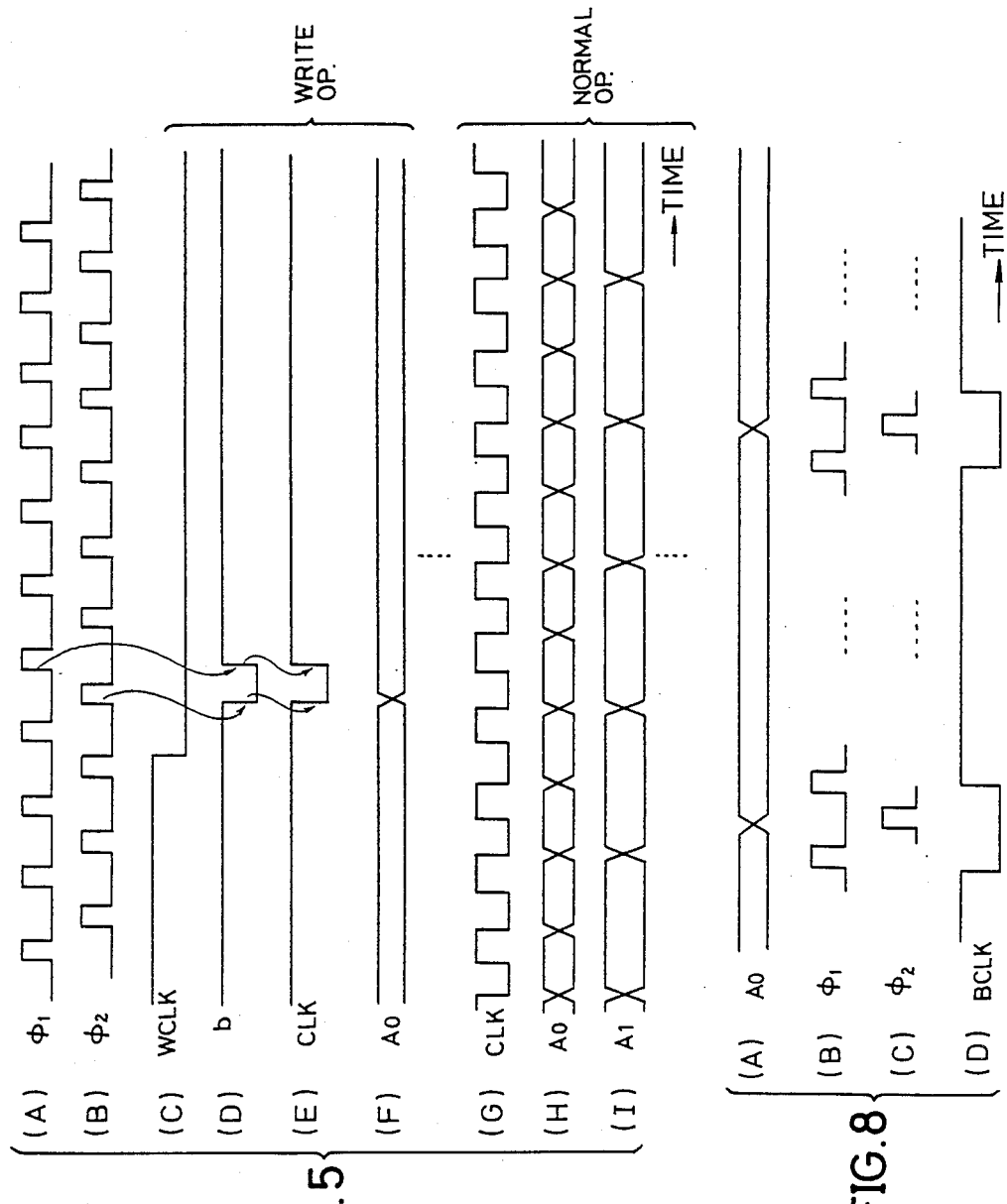

4,747,079

WRITE CIRCUIT FOR AN ERASABLE PROGRAMMABLE READ ONLY MEMORY DEVICE OF A MICROCOMPUTER

BACKGROUND OF THE INVENTION

The present invention generally relates to write circuits for erasable programmable read only memory devices of microcomputers. More particularly, the present invention is directed to a write circuit for an erasable programmable read only memory device of a microcomputer in which write-in addresses of the erasable programmable read only memory device can be generated by applying a low-frequency external clock signal to the write circuit.

Conventionally, when writing information into an erasable programmable read only memory (hereinafter simply referred to as an EPROM) of a microcomputer, there is a need to supply addresses of the EPROM from outside of the microcomputer. The conventional microcomputer consists of a program counter, a plurality of multiplexers, a word line driver, the EPROM and the like. Because the program counter operates in synchronization with a machine clock signal having a period of 2 to 3 microseconds during a normal operation mode (such as a read operation mode), it is impossible to obtain a sufficiently long write cycle in the order of 50 milliseconds from outputs of the program counter. For this reason, the microcomputer is provided with address terminals for receiving a write-in address during the write (program) operation mode. Thus, the multiplexers couple the outputs of the program counter to the word line driver during the normal operation mode, and switch over to couple the address terminals to the word line driver during the write operation mode.

However, especially in the case of a one-chip microcomputer, there is a limit to the number of terminals that can be provided. Accordingly, it is disadvantageous to reserve terminals for the address terminals described before. In addition, the conventional write circuit for the EPROM of the microcomputer suffers a problem in that the circuit construction is complex because of the need to provide the multiplexers for multiplexing the outputs of the program counter and the write-in address from the address terminals.

SUMMARY OF THE INVENTION

Accordingly, it is a general object of the present invention to provide a novel and useful write circuit for an EPROM device of a microcomputer in which the problems described heretofore are eliminated.

Another and more specific object of the present invention is to provide a write circuit for an EPROM device of a microcomputer comprising a first circuit responsive to an external clock signal WCLK and machine clock signals for supplying a clock signal CLK to a program counter of the microcomputer so as to successively increment an address produced in the program counter. The external clock signal WCLK has a frequency lower than those of the machine clock signals and the clock signal CLK has different frequencies during normal and write-in operation modes so that the address produced in the program counter is successively incremented in synchronization with the machine clock signals during the normal operation mode; and is successively incremented in synchronization with the external clock signal WCLK during the write operation mode. A second circuit is responsive to the machine clock signals and a bit data of a LSB of the address from the program counter generates a bit line clock signal BCLK for inhibiting a write-in data from being written into the EPROM device during a time period in which the address changes. According to the write circuit of the present invention, it is possible to generate a write-in address of the EPROM device during the write operation mode by simply applying the external clock signal WCLK to the first circuit. Hence, it is unnecessary to provide a plurality of address terminals on the microcomputer and it is sufficient to provide a terminal for receiving the external clock signal WCLK. For this reason, it is possible to more effectively utilize the limited number of terminals of the microcomputer. Furthermore, it is possible to positively prevent an erroneous write operation such as the writing of the write-in data into an erroneous address, because the bit line clock signal BCLK inhibits the write-in data from being written into the EPROM device during the time period in which the write-in address changes.

Other objects and further features of the present invention will be apparent from the following detailed description when read in conjunction with the accompanying drawings.

BRIEF DESCRIPTION OF THE DRAWINGS

FIGS. 3(A) through 3(C) are timing charts for explaining the operation of the block system shown in FIG. 2;

FIG. 4 is a circuit diagram of an embodiment of an essential part of the write circuit according to the present invention;

FIGS. 5(A) through 5(I) are timing charts for explaining the operation of the circuit shown in FIG. 4;

FIG. 6 is a diagram for explaining the incrementing of a write-in address in correspondence with a clock signal WCLK;

FIGS. 8(A) through 8(D) are timing charts for explaining the operation of the circuit shown in FIG. 7.

DESCRIPTION OF THE PREFERRED EMBODIMENTS

Figure 1:
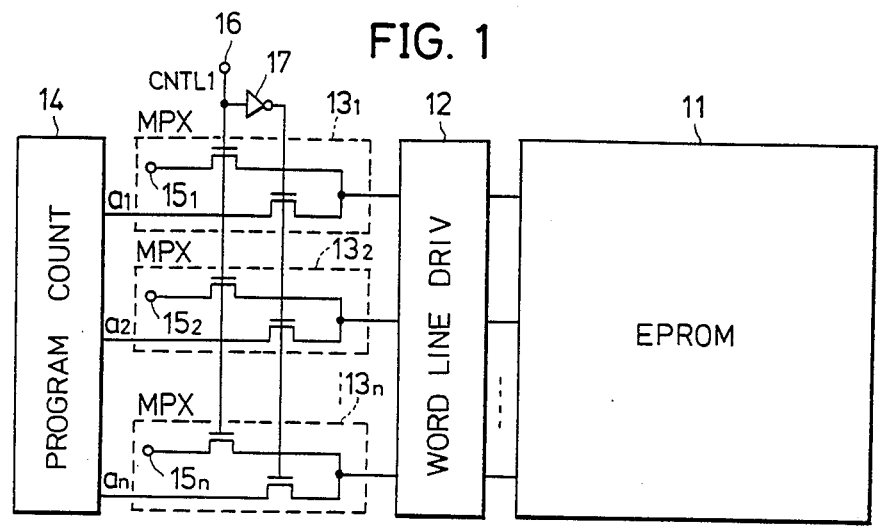
FIG. 1 is a block diagram of a conventional microcomputer including a program counter and an EPROM.

First, an explanation will be given with respect to an example of a conventional microcomputer consisting of an EPROM by referring to FIG. 1. The conventional microcomputer generally includes an EPROM 11, a word line driver 12, multiplexers $13_1$ through $13_n$, and a program counter 14. In FIG. 1, the illustration of a bit line driver and the like is omitted for convenience. The multiplexers $13_1$ through $13_n$ respectively comprise an N-channel transistor coupled to a terminal 16 and an N-channel transistor coupled to the terminal 16 via an inverter 17. When writing information into the EPROM 11, there is a need to supply addresses of the EPROM 11 from outside of the microcomputer. Because the program counter 14 operates in synchronization with a machine clock signal having a period of 2 to 3 microseconds during a normal operation mode such as a read operation mode, it is impossible to obtain a sufficiently long write cycle on the order of 50 milliseconds from outputs $a_1$ through $a_n$ of the program counter 14. For this reason, the microcomputer is provided with address terminals $15_1$ through $15_n$ for receiving a write-in address during the write operation mode. Thus, the multiplexers $13_1$ through $13_n$ couple the output address bits $a_1$ through $a_n$ of the program counter 14 to the word line driver 12 when a low-level switching control signal CNTL1 is applied to the terminal 16, for example, during the normal operation mode. In addition, the multiplexers switch over to couple the address terminals $15_1$ through $15_n$ to the word line driver 12 when a high-level switching control signal CNTL1 is applied to the terminal 16 during the write operation mode.

However, especially in the case of a one-chip microcomputer, there is a limit to the number of terminals that can be provided. Accordingly, it is disadvantageous to reserve terminals for the address terminals $15_1$ through $15_n$. In addition, the conventional write circuit for the EPROM of the microcomputer suffers a problem in that the circuit construction is complex because of the need to provide the multiplexers $13_1$ through $13_n$ for multiplexing the output address bits $a_1$ through $a_n$ of the program counter 14 and the write-in address from the address terminals $15_1$ through $15_n$.

Figure 2:
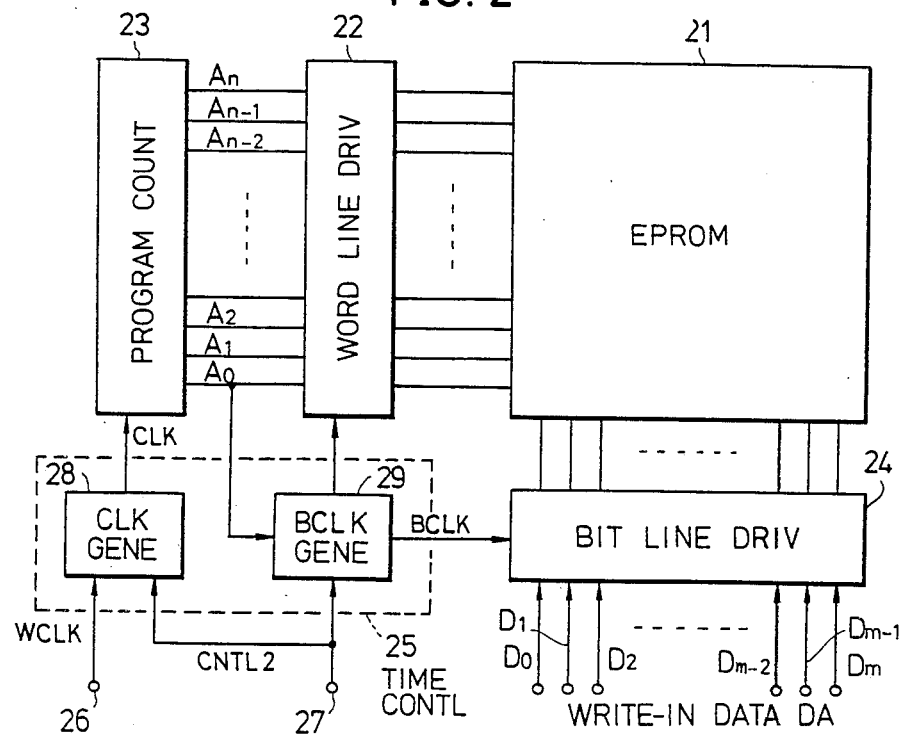
FIG. 2 is a block diagram of an embodiment of the write circuit for an EPROM device of a microcomputer according to the present invention together with essential parts of the microcomputer.

FIG. 2 is an embodiment of the write circuit for an EPROM device of a microcomputer according to the present invention together with essential parts of the microcomputer. The microcomputer generally comprises an EPROM 21, a word line driver 22, a program counter 23, and a bit line driver 24. The write circuit according to the present invention comprises a write timing control circuit 25. The write timing control circuit 25 comprises a clock generating circuit 28 and a bit line clock generating circuit 29. An external low-frequency clock signal WCLK is supplied to the clock generating circuit 28 from a terminal 26, and a control signal CNTL2 is supplied to the clock generating circuit 28 and the bit line clock generating circuit 29 from a terminal 27. For example, the control signal CNTL2 has a high level during a normal operation mode and has a low level during a write operation mode. Machine clock signals $\bar{\phi}_1$ and $\bar{\phi}_2$ (and inverted signals $\phi_1$ and $\phi_2$ thereof) having mutually different phases so that pulses thereof do not overlap are also supplied to the clock generating circuit 28 and the bit line clock generating circuit 29. The machine clock signals $\phi_1$ and $\phi_2$ have a period on the order of several microseconds.

The clock generating circuit 28 generates, from the external clock signal WCLK shown in FIG. 3(A) and the control signal CNTL2, a clock signal CLK during the write operation mode and the program counter 23 generates a write-in address ADDR shown in FIG. 3(B) represented by address bits A0 through An in response to trailing edges of the external clock signal WCLK. The bit line clock generating circuit 29 generates, from a least significant bit (LSB) A0 of the write-in address ADDR, the machine clock signals $\phi_1$ and $\phi_2$ and the control signal CNTL2, a bit line clock signal BCLK for inhibiting a write-in data DA shown in FIG. 3(C) (represented by data bits D0 through Dm) from being supplied to the EPROM 21 from the bit line driver 24 when the write-in address ADDR changes. For example, the write-in data DA is inhibited from being written into the EPROM 21 when the bit line clock signal BCLK has a low level.

According to the embodiment of the present invention, it is possible to generate the write-in address of the EPROM 21 by simply applying the external clock signal WCLK to the clock generating circuit 28 and applying the output clock signal CLK of the clock generating circuit 28 to the program counter 23. Hence, it is unnecessary to provide a plurality of address terminals on the microcomputer and it is sufficient to provide the terminal 26 for receiving the external clock signal WCLK. For this reason, it is possible to more effectively utilize the limited number of terminals of the microcomputer. Furthermore, it is possible to positively prevent an erroneous write operation such as the writing of the write-in data into an erroneous address, because the bit line clock signal BCLK inhibits the write-in data from being written into the EPROM 21 during the time period in which the write-in address changes.

FIG. 4 is an embodiment of an essential part of the write circuit together with an essential part of the microcomputer. In FIG. 4, those parts which are the same as those in FIG. 2 are designated by the same reference numerals, and description thereof will be omitted. The clock generating circuit 28 comprises a first transfer gate 31 including P-channel transistors Q1 and Q2 and N-channel transistors Q3 and Q4, a second transfer gate 32 including P-channel transistors Q5 and Q6 and N-channel transistors Q7 and Q8, an AND circuit 33, a NOR circuit 34, a gate circuit 35 including P-channel transistors Q9 and Q10 and an N-channel transistor Q11, and an inverter 36. The first transfer gate 31 is supplied with the clock signal WCLK from the terminal 26 and the machine clock signals $\phi_2$ and $\bar{\phi}_2$. The second transfer gate 32 is supplied with an output signal of the first transfer gate 31 and the machine clock signals $\phi_1$ and $\bar{\phi}_1$. The AND circuit 33 is supplied with the output signals of the first and second transfer gates 31 and 32. The NOR circuit 34 is supplied with an output signal of the AND circuit 33 and the control signal CNTL2 from the terminal 27. The gate circuit 35 is supplied with an output signal of the NOR circuit 34 and the machine clock signals $\phi_1$ and $\bar{\phi}_2$. An output signal of the gate circuit 35 is supplied to the program counter 23 as an output clock signal CLK of the clock generating circuit 28.

During the normal operation mode, the control signal CNTL2 applied to the terminal 27 has a high level. Hence, a low-level output is obtained from the NOR circuit 34, and as shown in FIG. 5(G), an output signal CLK of the inverter 36 rises with a rise in the machine clock signal $\phi_1$ shown in FIG. 5(A) and falls with a rise in the machine clock signal $\phi_2$ shown in FIG. 5(B). As a result, the address produced in the program counter 23 is incremented in response to the output signal of the inverter 36 in synchronization with the machine clock signals $\phi_1$ and $\phi_2$, and access is made to the EPROM 21 shown in FIG. 2 in synchronization with the output signal of the inverter 36. FIGS. 5(H) and 5(I) show the periods with which the address bits A0 and A1 change, respectively.

During the write (program) operation mode, the control signal CNTL2 applied to the terminal 27 has a low level. Hence, a high-level output is obtained from the NOR circuit 34 when a low-level signal is supplied to the other input terminal of the NOR circuit 34. In other words, the source of the clock signal supplied to the program counter 23 is changed from the machine clock signals $\phi_1$ and $\phi_2$ of the microcomputer to the external low-frequency clock signal WCLK having a period T of, for example, 50 msec. When the external clock signal WCLK from the terminal 26 falls as shown in FIG. 5(C), a signal b shown in FIG. 5(D) which falls with a rise in the machine clock signal $\phi_2$ shown in FIG. 5(B) and rises with a rise in the machine clock signal $\phi_1$ shown in FIG. 5(A) is obtained from the NOR circuit 34. As a result, a signal CLK shown in FIG. 5(E) is obtained from the inverter 36 and is supplied to the program counter 23. The address produced in the program counter 23 is incremented responsive to a fall in the output signal CLK of the inverter 36. FIG. 6 shows the incrementing of the write-in address produced in the program counter 23 with reference to the external clock signal WCLK for a case where the address includes, for example, three bits. It may be seen from FIG. 6 that the address is incremented in response to each fall in the external clock signal WCLK. Therefore, the selection of the write-in address of the EPROM 21 is performed in synchronization with the external clock signal WCLK.

Figure 7:
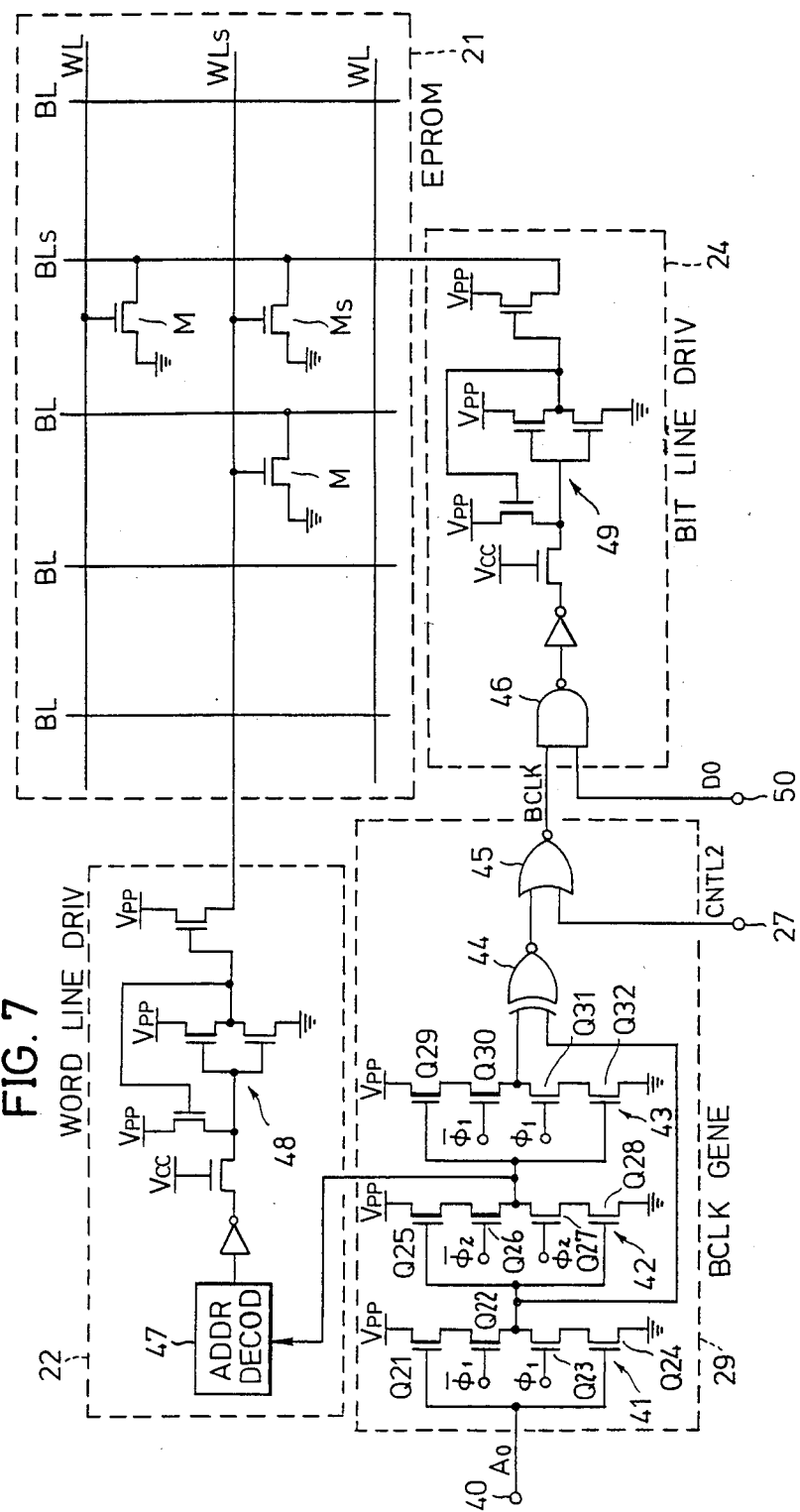
FIG. 7 is a circuit diagram of an embodiment of another essential part of the write circuit according to the present invention together with related circuit parts of the microcomputer.

FIG. 7 shows an embodiment of another essential part of the write circuit together with an essential part of the microcomputer. In FIG. 7, those parts which are the same as those in FIG. 2 are designated by the same reference numerals, and description thereof will be omitted. The LSB A0 of the address from the program counter 23 is applied to a terminal 40 and is supplied to the bit line clock generating circuit 29. The bit line clock generating circuit 29 comprises a first transfer gate 41 including P-channel transistors Q21 and Q22 and N-channel transistors Q23 and Q24, a second transfer gate 42 including P-channel transistors Q25 and Q26 and N-channel transistors Q27 and Q28, a third transfer gate 43 including P-channel transistors Q29 and Q30 and N-channel transistors Q31 and Q32, an exclusive-OR circuit 44, and a NOR circuit 45. The first transfer gate 41 is supplied with the LSB A0 of the address and the machine clock signals $\phi_1$ and $\overline{\phi_1}$. The second transfer gate 42 is supplied with an output signal of the first transfer gate 41 and the machine clock signals $\phi_2$ and $\overline{\phi_2}$. The third transfer gate 43 is supplied with an output signal of the second transfer gate 42 and the machine clock signals $\phi_1$ and $\overline{\phi_1}$. The exclusive-OR circuit 44 is supplied with the output signals of the second and third transfer gates 42 and 43, and an output signal of the exclusive-OR circuit 44 is supplied to one input terminal of the NOR circuit 45. The control signal CNTL2 from the terminal 27 is supplied to the other input terminal of the NOR circuit 45. An output signal of the NOR circuit 45 is supplied to one input terminal of a NAND circuit 46 of the bit line driver 24 as an output bit line clock signal BCLK of the bit line clock generating circuit 29.

The word line driver 22 comprises an address decoder 47 and a driving circuit 48 including an inverter and N-channel and P-channel transistors. The output signal of the second transfer gate 42, that is, the delayed word address bit A0 which has been delayed by the first and second transfer gates 41 and 42 under the control of the machine clock signals $\phi_1$ and $\phi_2$, is decoded in the address decoder 47, and the driving circuit 48 drives a selected word line WLs, for example. As a result, an information is written into a selected memory cell Ms of the EPROM 21 when the word line WLs and a bit line BLs coupled to the selected memory cell Ms are driven. Since other word lines WL are not driven, no information is written into other memory cells M coupled to the bit line BLs. The memory cells of the EPROM 21 are arranged in a matrix arrangement and are coupled to respective word lines WL and bit lines BL, but only a portion of the EPROM 21 is shown in FIG. 7 for convenience.

The bit line driver 24 comprises the NAND circuit 46 and a driving circuit 49 comprising N-channel and P-channel transistors. For example, the data bit D0 of the write-in data DA is applied to a terminal 50 and is supplied to the other input terminal of the NAND circuit 46. Hence, the driving circuit 49 drives the selected bit line BLs only when the bit line clock signal BCLK has a high level, and the driving of the bit line BLs is inhibited during a low-level period of the bit line clock signal BCLK. In other words, the write-in operation to the EPROM 21 is inhibited during the low-level period of the bit line clock signal BCLK. The low-level period of the bit line clock signal BCLK is on the order of several microseconds, that is, one machine clock cycle.

FIGS. 8(A) through 8(D) are timing charts showing the relationships of the LSB A0 of the address, the machine clock signals $\phi_1$ and $\phi_2$ and the bit line clock signal BCLK. It may be seen from FIGS. 8(A) and 8(D) that the bit line clock signal BCLK inhibits the write-in to the EPROM 21 during a time period in which the address change takes place.

Further, the present invention is not limited to these embodiments, but various variations and modifications may be made without departing from the scope of the present invention.

What is claimed is:

1. A write circuit for an erasable programmable read only memory device of a microcomputer, said microcomputer including a program counter for providing an address and operating in synchronization with machine clock signals, said write circuit comprising:
    a clock generating circuit, coupled to receive an external clock signal and the machine clock signals, for supplying a clock signal to said program counter in response to the external clock signal and the machine clock signals so as to successively increment the address produced in the program counter, the external clock signal having a frequency lower than the frequencies of the machine clock signals, the clock signal having different frequencies during a normal operation mode and a write-in operation mode so that the address produced in the program counter is successively incremented in synchronization with the machine clock signals during the normal operation mode and is successively incremented in synchronization with the external clock signal during the write operation mode; and
    a bit line clock generating circuit, coupled to receive the machine clock signals and a least significant bit of the address from the program counter, for generating a bit line clock signal for inhibiting a write-in data from being written into the erasable programmable read only memory device in response to the machine clock signals and least significant bit of the address during a time period in which the address changes.

2. A write circuit for an erasable programmable read only memory device of a microcomputer as claimed in claim 1, wherein the machine clock signals comprise first and second machine clock signals having mutually different phases so that pulses thereof do not overlap, wherein said clock generating circuit is supplied with a control signal indicating whether the operation mode of the erasable programmable read only memory device is a normal operation mode or a write-in operation mode, said clock generating circuit generating the clock signal which rises and falls in response to transitions of the first and second machine clock signals when the control signal indicates the normal operation mode, wherein the clock signal undergoes a first transition in response to a transition of the second machine clock signal and undergoes a second transition in response to a transition of the first machine clock signal only when the external clock signal undergoes a transition.

3. A write circuit for an erasable programmable read only memory device of a microcomputer as claimed in claim 2, wherein said clock generating circuit generates the clock signal which rises with a rise in the first machine clock signal and falls with a rise the second machine clock signal when the control signal CNTL2 indicates the normal operation mode, and generates the clock signal CLK which falls with a rise in the second machine clock signal and rises with a rise in the first machine clock signal only when the external clock signal falls.

4. A write circuit for an erasable programmable read only memory device of a microcomputer as claimed in claim 2, wherein the first and second machine clock signals have a period on the order of several microseconds, and wherein the clock signal has a period on the order of fifty milliseconds.

5. A write circuit for an erasable programmable read only memory device of a microcomputer as claimed in claim 1, wherein the machine clock signals comprise first and second machine clock signals having mutually different phases so that pulses thereof do not overlap, and wherein said bit line clock generating circuit comprises:
  a delay circuit for delaying bit data of a least significant bit of the address by using one of the first and second machine clock signals so as to produce a delayed bit data;
  an exclusive-OR circuit coupled to receive the bit data and the delayed bit data of the least significant bit of the address and outputting an output signal; and
  a NOR circuit coupled to receive an output signal of said exclusive-OR circuit and a control signal indicative of whether the operation mode of the erasable programmable read only memory device is the normal operation mode or the write-in operation mode, said NOR circuit producing the bit line clock signal.

6. A write circuit for an erasable programmable read only memory device of a microcomputer as claimed in claim 1, wherein the clock signal has a period which is sufficiently long for writing information into the erasable programmable read only memory device during the write operation mode.

7. A write circuit for an erasable programmable read only memory device of a microcomputer as claimed in claim 1, further comprising:

a word line driver, coupled to receive the address from said program counter for driving a word line of said erasable programmable read only memory device; and
a bit line driver, coupled to receive write-in data and the bit line clock signal from said bit line clock generating circuit, for driving a bit line in the erasable programmable read only memory device excluding the time period in which the address changes.

8. A write circuit for an erasable programmable read only memory device coupled to receive machine clock signals, comprising:
  a bit line driver circuit coupled to the erasable programmable read only memory device;
  a word line driver circuit coupled to the erasable programmable read only memory device;
  a program counter, coupled to said word line driver circuit, for providing a write-in address to said word line driver circuit; and
  a write timing control circuit coupled to said program counter and said word line driver, including:
    a clock generator circuit, coupled to said program counter and coupled to receive an external low frequency clock signal and a control signal during a write operation, for enabling said program counter to generate a write-in address in accordance with the external low frequency clock signal and the control signal; and
    a bit line clock generator circuit, coupled to said program counter, said bit line driver and said word line driver, for receiving a least significant bit of the write-in address from said program counter and the control signal, and inhibiting a write-in data from being supplied to the erasable programmable read only memory device from said bit line driver circuit.

9. A write circuit as set forth in claim 8, wherein said clock generator circuit comprises:
  a first transfer gate coupled to receive the external low frequency clock signal;
  a second transfer gate coupled to said first transfer gate;
  an AND gate coupled to said first and second transfer gates;
  a NOR gate coupled to said AND gate and connected to receive the control signal; and
  a gate circuit, coupled to said NOR circuit, outputting a clock signal to said program counter.

10. The write circuit as set forth in claim 8, wherein said bit line clock generator circuit comprises:
  a first transfer gate coupled to receive the least significant bit of the address;
  a second transfer gate coupled to said first transfer gate;
  a third transfer gate coupled to said second transfer gate;
  an exclusive-OR gate coupled to said third transfer gate and said first transfer gate; and
  a NOR circuit, coupled to said exclusive-OR gate and coupled to receive the control signal, for providing an output signal to said bit line driver circuit.

* * * * *

UNITED STATES PATENT AND TRADEMARK OFFICE
CERTIFICATE OF CORRECTION

PATENT NO. : 4,747,079
DATED : MAY 24, 1988
INVENTOR(S) : SATORU YAMAGUCHI

It is certified that error appears in the above-identified patent and that said Letters Patent is hereby corrected as shown below:

Col. 3, line 46, "$\bar{\phi}_1$ and $\bar{\phi}_2$" should be --$\phi_1$ and $\phi_2$--; and "$\phi_1$ and $\phi_2$" should be --$\bar{\phi}_1$ and $\bar{\phi}_2$--.

Col. 4, line 34, "$\phi_2$" (second occurrence) should be --$\bar{\phi}_2$--.

Col. 7, line 18, aftert "rise" insert --in--.

Signed and Sealed this

Sixth Day of February, 1990

Attest:

JEFFREY M. SAMUELS

Attesting Officer   Acting Commissioner of Patents and Trademarks